United States Patent
Xu et al.

(10) Patent No.: US 10,568,218 B1
(45) Date of Patent: Feb. 18, 2020

(54) NARROW BEZEL DISPLAY

(71) Applicant: WUHAN CHINA STAR OPTOELECTRONICS SEMICONDUCTOR DISPLAY TECHNOLOGY CO., LTD., Wuhan, Hubei (CN)

(72) Inventors: Huan Xu, Hubei (CN); Peiyu Lai, Hubei (CN)

(73) Assignee: WUHAN CHINA STAR OPTOELECTRONICS SEMICONDUCTOR DISPLAY TECHNOLOGY CO., LTD., Wuhan, Hubei (CN)

( * ) Notice: Subject to any disclaimer, the term of this patent is extended or adjusted under 35 U.S.C. 154(b) by 0 days.

(21) Appl. No.: 16/326,211

(22) PCT Filed: Nov. 27, 2018

(86) PCT No.: PCT/CN2018/117679
§ 371 (c)(1),
(2) Date: Feb. 17, 2019

(51) Int. Cl.
*H05K 5/00* (2006.01)
*G02F 1/1333* (2006.01)
*H05K 1/18* (2006.01)

(52) U.S. Cl.
CPC ......... *H05K 5/0017* (2013.01); *G02F 1/1333* (2013.01); *H05K 1/189* (2013.01); *G02F 2001/133317* (2013.01); *G02F 2201/00* (2013.01); *H05K 2201/10128* (2013.01)

(58) Field of Classification Search
CPC combination set(s) only.
See application file for complete search history.

(56) References Cited

U.S. PATENT DOCUMENTS

| | | | |
|---|---|---|---|
| 9,189,016 B2* | 11/2015 | Jang | G06F 1/1652 |
| 9,778,774 B2* | 10/2017 | Jang | G06F 1/1652 |
| 9,872,408 B2* | 1/2018 | Choi | H04M 1/18 |
| 9,885,820 B2* | 2/2018 | Kim | G02B 6/0035 |
| 9,992,893 B2* | 6/2018 | Choi | H04M 1/18 |
| 10,010,005 B2* | 6/2018 | Hyun | H05K 1/115 |
| 10,146,075 B2* | 12/2018 | Hirasawa | G02F 1/133308 |
| 10,198,042 B2* | 2/2019 | Tang | G06F 1/16 |
| 2014/0091336 A1* | 4/2014 | Sanford | G06F 1/1626 257/88 |
| 2016/0370641 A1* | 12/2016 | Hirasawa | G02F 1/133308 |
| 2017/0048990 A1* | 2/2017 | Sim | H05K 1/147 |
| 2018/0113566 A1* | 4/2018 | Shigemori | G06F 3/04886 |
| 2019/0155340 A1* | 5/2019 | Tang | G06F 1/16 |

* cited by examiner

*Primary Examiner* — Lisa Lea-Edmonds
(74) *Attorney, Agent, or Firm* — Mark M. Friedman

(57) ABSTRACT

A narrow bezel display is provided and includes a middle frame, a glass cover plate and a display panel bonded to the glass cover plate. The display panel includes a displaying portion and a curved portion located on a side of the displaying portion and is connected to the displaying portion. A gap is defined between the curved portion and the glass cover plate. The middle frame includes a bottom surface supporting portion and a side surface supporting portion, and a recess is defined in the side surface supporting portion. A portion of the glass cover plate corresponding to the gap is connected to the side surface supporting portion. The curved portion of the display panel is accommodated in the recess.

18 Claims, 3 Drawing Sheets

NARROW BEZEL DISPLAY

FIELD OF INVENTION

The present invention relates to the field of display technology, and particularly to a narrow bezel display.

BACKGROUND OF INVENTION

With the wide development of smart phones, especially the popular use of mobile phones having organic light emitting diode (OLED) screens, people increasingly pursue full-screen display, and at the same time, demands for some functions such as waterproof and shatterproof are gradually increased. Manufacturing narrower bezels for the displays or mobile phones to achieve the full screen display has become mainstream. A traditional mobile phone reduces the bezel by bending the bonding area to a rear of the display panel. However, limitations of flexibility and radius of curvature of the display panel and the width of the bezel waterproof glue still affect the development of the narrow bezel.

Therefore, the conventional technology with defects needs improvement immediately.

SUMMARY OF INVENTION

The present invention provides a narrow bezel display that can effectively reduce a width of a bezel, increase screen-to-body ratio and achieve the goal of narrowing the bezel for the display.

To achieve the above goal, the present invention provides technical solutions as follows.

The present invention provides a narrow bezel display, including a middle frame, a glass cover plate and a display panel bonded to the glass cover plate.

The display panel includes a displaying portion and a curved portion located at a side of the displaying portion and connected to the displaying portion. The displaying portion is bonded to the glass cover plate, and a gap is defined between the curved portion and the glass cover plate.

The middle frame includes a bottom surface supporting portion and a side surface supporting portion disposed on an end portion of the bottom surface supporting portion, and a recess is defined in the side surface supporting portion.

A portion of the glass cover plate corresponding to the gap is connected to the side surface supporting portion of the middle frame, the curved portion of the display panel is received in the recess, and an interval is defined between the recess and the curved portion.

In the narrow bezel display of the present invention, the recess is defined in a sidewall of the side surface supporting portion and corresponds to the curved portion.

In the narrow bezel display of the present invention, the glass cover plate is adhered and connected to the side surface supporting portion by an adhesive layer.

In the narrow bezel display of the present invention, a first protruding portion and an adhering portion are formed on the side surface supporting portion close to an end of the glass cover plate, the adhering portion is located on a side of the first protruding portion, the first protruding portion contacts a side surface of the glass cover plate, and the adhering portion is adhered to the glass cover plate by the adhesive layer.

In the narrow bezel display of the present invention, the adhering portion is sandwiched between the curved portion the display panel and the gap of the glass cover plate.

In the narrow bezel display of the present invention, the side surface supporting portion includes a second protruding portion, and the recess is defined between the second protruding portion and the bottom surface supporting portion.

In the narrow bezel display of the present invention, the glass cover plate is adhered to the second protruding portion of the middle frame.

In the narrow bezel display of the present invention, the display panel further includes a non-displaying portion located on a side of the curved portion, and the curved portion is configured to fold the non-displaying portion to a rear surface of the displaying portion.

In the narrow bezel display of the present invention, a cross-section of the recess is semi-circular-shaped or U-shaped.

To achieve the above objective, the present invention also provides a narrow bezel display, including a middle frame, a glass cover plate and a display panel bonded to the glass cover plate.

The display panel includes a displaying portion and a curved portion located at a side of the displaying portion and connected to the displaying portion, the displaying portion is bonded to the glass cover plate, and a gap is defined between the curved portion and the glass cover plate.

The middle frame includes a bottom surface supporting portion and a side surface supporting portion disposed on an end portion of the bottom surface supporting portion, and a recess is defined in the side surface supporting portion.

A portion of the glass cover plate corresponding to the gap is connected to the side surface supporting portion of the middle frame, the curved portion of the display panel is received in the recess, and an interval is defined between the recess and the curved portion.

In the narrow bezel display of the present invention, the recess is defined in a sidewall of the side surface supporting portion and corresponds to the curved portion.

In the narrow bezel display of the present invention, the glass cover plate is adhered and connected to the side surface supporting portion by an adhesive layer.

In the narrow bezel display of the present invention, a first protruding portion and an adhering portion are formed on the side surface supporting portion close to an end of the glass cover plate, the adhering portion is located on a side of the first protruding portion, the first protruding portion contacts a side surface of the glass cover plate, and the adhering portion is adhered to the glass cover plate by the adhesive layer.

In the narrow bezel display of the present invention, the adhering portion is sandwiched between the curved portion the display panel and the gap of the glass cover plate.

In the narrow bezel display of the present invention, the side surface supporting portion includes a second protruding portion, and the recess is defined between the second protruding portion and the bottom surface supporting portion.

In the narrow bezel display of the present invention, the glass cover plate is adhered to the second protruding portion of the middle frame.

In the narrow bezel display of the present invention, the display panel also includes a non-displaying portion located on a side of the curved portion, and the curved portion is configured to fold the non-displaying portion to a rear surface of the displaying portion.

In the narrow bezel display of the present invention, a cross-section of the recess is semi-circular-shaped or U-shaped.

Advantages of the present invention are as follows. Compared to the conventional display, the narrow bezel display provided by the present invention, by defining a placement recess in an inner sidewall of the middle frame, accommodates a curved region of the curved portion of the display panel in the placement recess defined in the sidewall of the middle frame. When the glass cover plate is adhered to the middle frame, because the curved portion in the curved region of the display panel is accommodated by the placement recess of the middle frame instead of occupying the space of a bezel region, a width of the bezel is effectively reduced and the screen-to-body ratio is increased.

DESCRIPTION OF DRAWINGS

To more clearly elaborate on the technical solutions of embodiments of the present invention or prior art, appended figures necessary for describing the embodiments of the present invention or prior art will be briefly introduced as follows. Apparently, the following appended figures are merely some embodiments of the present invention. A person of ordinary skill in the art may acquire other figures according to the appended figures without any creative effort.

DETAILED DESCRIPTION OF PREFERRED EMBODIMENTS

Figure 1:
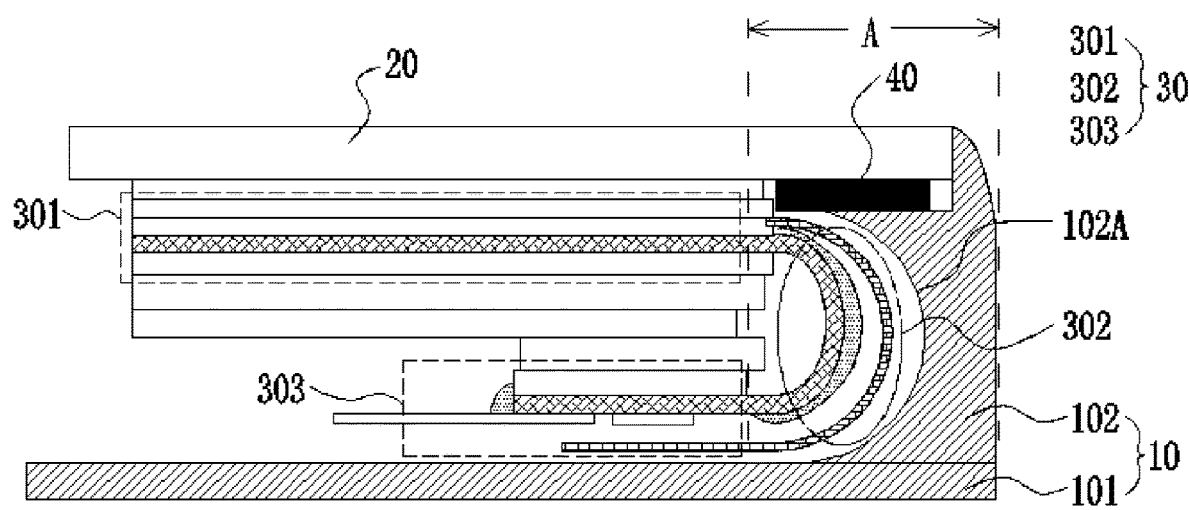
FIG. 1 is a structural schematic view of a narrow bezel display provided by an embodiment of the present invention.

Each of the following embodiments is described with appending figures to illustrate specific embodiments of the present invention that are applicable. The terminologies of direction mentioned in the present invention, such as "upper", "lower", "front", "rear", "left", "right", "inner", "outer", "side surface", etc., only refer to the directions of the appended figures. Therefore, the terminologies of direction are used for explanation and comprehension of the present invention, instead of limiting the present invention. In the figures, units with similar structures are marked with the same reference characters.

The present invention aims at technical issues of a conventional display with limitations of flexibility and radius of curvature of the display panel, and a width of the bezel waterproof glue. The present invention can solve the issues.

With reference to FIG. 1, FIG. 1 is a structural schematic view of a narrow bezel display provided by an embodiment of the present invention. The narrow bezel display includes a middle frame 10, a glass cover plate 20 and a display panel 30 bonded to the glass cover plate 20. The display panel 30 includes a displaying portion 301 and a curved portion 302 located at a side of the displaying portion 301 and connected to the displaying portion 301. The displaying portion 301 is bonded to the glass cover plate 20. A gap is defined between the curved portion 302 and the glass cover plate 20. The display panel 30 further includes a non-displaying portion 303 located at a side of the curved portion 302 and connected to the curved portion 302. The curved portion 302 is configured to facilitate folding of the non-displaying portion 303 to a rear surface of the displaying portion 301.

The middle frame 10 includes a bottom surface supporting portion 101 and a side surface supporting portion 102 disposed on an end of the bottom surface supporting portion 101. A recess 102A is defined the side surface supporting portion 102. A portion of the glass cover plate 20 corresponding to the gap is connected to the side surface supporting portion 102 of the middle frame 10. The curved portion 302 of the display panel 30 is accommodated in the recess 102A such that the curved portion 302 of the display panel 30 occupies the bezel as less as possible. In other words, a bonding position of the side surface supporting portion 102 and the glass cover plate 20 is close to an outer edge of the displaying portion 301 as much as possible, whereby a narrower interval A of the bezel is obtained.

In the embodiment of the present invention, the side surface supporting portion 102 and the bottom surface supporting portion 101 are formed integrally. The recess 102A is defined in a sidewall of the side surface supporting portion 102 and corresponds to the curved portion 302. The curved portion 302 is received in the recess 102A.

The glass cover plate 20 is adhered and connected to the side surface supporting portion 102 by an adhesive layer 40. In the embodiment of the present invention, the adhesive layer 40 is a waterproof-adhesive layer and can prevent external water vapor from entering an inside of the display panel 30 and eroding components therein.

The displaying portion 301 of the display panel 30 bonded to the glass cover plate 20 is planar, and the non-displaying portion 303 extending from the folding curved portion 302 to the rear of the displaying portion 301 is also planar.

After the glass cover plate 20 is adhered to the middle frame 10, an interval is defined between the recess 102A and the curved portion 302 such that the curved portion 302 in the recess 102A is prevented from being damaged due to limitation of radius of curvature of the curved portion 302 or deformation of the middle frame 10 when it is squeezed.

In an embodiment of the present invention, the display panel 30 includes but is not limited to a backplate, a flexible substrate, a thin film transistor layer, a pixel unit layer, an encapsulation layer, a touch layer, and a polarizer.

Figure 2:
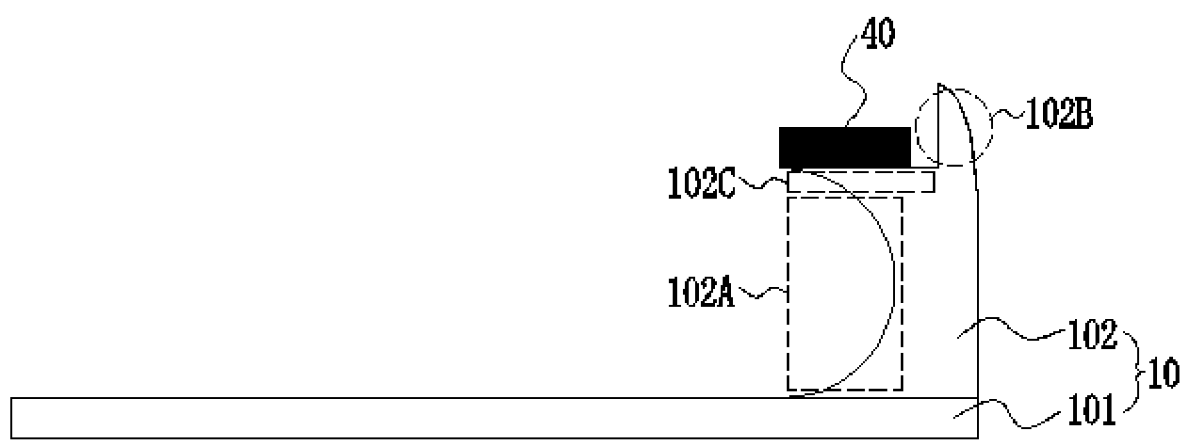
FIG. 2 is a structural schematic view of a middle frame provided by the embodiment of the present invention.

With reference to FIG. 2, a structural schematic view of a middle frame provided by the embodiment of the present invention is shown. The side surface supporting portion 102 of the middle frame 10 is disposed on an end of the bottom surface supporting portion 101. A first protruding portion 102B and an adhering portion 102C are formed on the side surface supporting portion 102 close to an end of the glass cover plate 20. The adhering portion is located on a side of the first protruding portion 102B. The first protruding portion 102B contacts a side surface of the glass cover plate 20, as shown in FIG. 1. The adhering portion 102C is adhered to the glass cover plate 20 by the adhesive layer 40. By adopting such design, the first protruding portion 102B not only performs limiting functions during the adhering process of the glass cover plate 20 and the side surface supporting portion 102, but also cooperates with the glass cover plate 20 to perform the encapsulating function to the adhesive layer 40 to further prevent ambient water vapor from entering the inside of the display panel 30 and damaging components therein.

The adhering portion 102C is sandwiched in the gap defined between the curved portion 302 of the display panel 30 and the glass cover plate 20.

In the embodiment of the present invention, a shape of the adhering portion 102C corresponds to the gap. The adhering portion 102C can correspond to a position of the gap, and can be adhered to the glass cover plate 20 by the adhesive layer 40.

The recess 102A is defined in an inner sidewall of the side surface supporting portion 102. A cross-section of the recess 102A is semi-circular or semi-elliptical. The inner sidewall of the side surface supporting portion 102 is curved and is configured to receive the curved portion 302 of the display panel 30.

Figure 3:
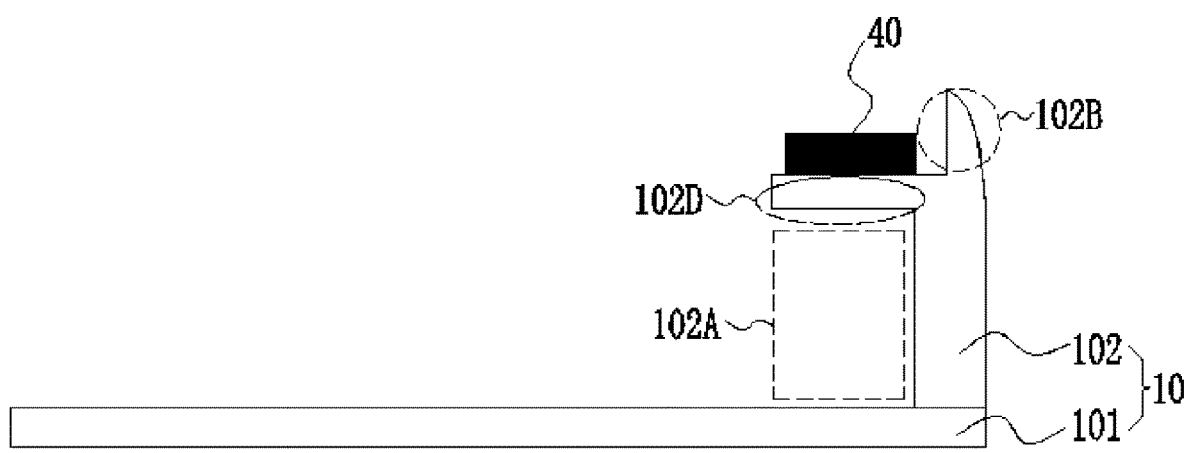
FIG. 3 is a structural schematic view of another middle frame provided by the embodiment of the present invention.

With reference to FIG. 3, FIG. 3 is a structural schematic view of another middle frame provided by the embodiment of the present invention. Compared to the middle frame in FIG. 2, distinguishing features of the middle frame in FIG. 3 are as follows. The side surface supporting portion 102 is inverted L-shaped. In other words, the side surface supporting portion 102 includes a second protruding portion 102D, and the second protruding portion 102D cooperates with the bottom surface supporting portion 101 to define the recess 102A. A cross-section of the recess 102A can be U-shaped. The glass cover plate 20 is adhered to the second protruding portion 102D of the middle frame 10.

The narrow bezel display is provided by the present invention, by defining a placement recess in an inner sidewall of the middle frame, which accommodates a curved region of the curved portion of the display panel in the placement recess defined in the sidewall of the middle frame. When the glass cover plate is adhered to the middle frame, because the curved portion in the curved region of the display panel is accommodated by the placement recess of the middle frame instead of occupying the space of a bezel region, a width of the bezel is effectively reduced and the screen-to-body ratio is increased.

Although the preferred embodiments of the present invention have been disclosed as above, the aforementioned preferred embodiments are not used to limit the present invention. The person of ordinary skill in the art may make various changes and modifications without departing from the spirit and scope of the present invention. Therefore, the scope of protection of the present invention is defined by the scope of the claims.

What is claimed is:

1. A narrow bezel display, comprising: a middle frame, a glass cover plate and a display panel bonded to the glass cover plate;
    wherein the display panel comprises a displaying portion and a curved portion located at a side of the displaying portion and connected to the displaying portion, the displaying portion is bonded to the glass cover plate, and a gap is defined between the curved portion and the glass cover plate;
    wherein the middle frame comprises a bottom surface supporting portion and a side surface supporting portion disposed on an end portion of the bottom surface supporting portion, and a recess is defined in the side surface supporting portion; and
    wherein a portion of the glass cover plate corresponding to the gap is connected to the side surface supporting portion of the middle frame, the curved portion of the display panel is received in the recess, and an interval is defined between the recess and the curved portion.

2. The narrow bezel display as claimed in claim 1, wherein the recess is defined in a sidewall of the side surface supporting portion and corresponds to the curved portion.

3. The narrow bezel display as claimed in claim 2, wherein the glass cover plate is adhered and connected to the side surface supporting portion by an adhesive layer.

4. The narrow bezel display as claimed in claim 3, wherein a first protruding portion and an adhering portion are formed on the side surface supporting portion close to an end of the glass cover plate, the adhering portion is located on a side of the first protruding portion, the first protruding portion contacts a side surface of the glass cover plate, and the adhering portion is adhered to the glass cover plate by the adhesive layer.

5. The narrow bezel display as claimed in claim 4, wherein the adhering portion is sandwiched between the curved portion the display panel and the gap of the glass cover plate.

6. The narrow bezel display as claimed in claim 1, wherein the side surface supporting portion comprises a second protruding portion, and the recess is defined between the second protruding portion and the bottom surface supporting portion.

7. The narrow bezel display as claimed in claim 6, wherein the glass cover plate is adhered to the second protruding portion of the middle frame.

8. The narrow bezel display as claimed in claim 1, wherein the display panel further comprises a non-displaying portion located on a side of the curved portion, and the curved portion is configured to fold the non-displaying portion to a rear surface of the displaying portion.

9. The narrow bezel display as claimed in claim 1, wherein a cross-section of the recess is semi-circular-shaped or U-shaped.

10. A narrow bezel display, comprising: a middle frame, a glass cover plate and a display panel bonded to the glass cover plate;
    wherein the display panel comprises a displaying portion and a curved portion located at a side of the displaying portion and connected to the displaying portion, the displaying portion is bonded to the glass cover plate, and a gap is defined between the curved portion and the glass cover plate;
    wherein the middle frame comprises a bottom surface supporting portion and a side surface supporting portion disposed on an end portion of the bottom surface supporting portion, and a recess is defined in the side surface supporting portion; and
    wherein a portion of the glass cover plate corresponding to the gap is connected to the side surface supporting portion of the middle frame, the curved portion of the display panel is received in the recess, and an interval is defined between the recess and the curved portion.

11. The narrow bezel display as claimed in claim 10, wherein the recess is defined in a sidewall of the side surface supporting portion and corresponds to the curved portion.

12. The narrow bezel display as claimed in claim 11, wherein the glass cover plate is adhered and connected to the side surface supporting portion by an adhesive layer.

13. The narrow bezel display as claimed in claim 12, wherein a first protruding portion and an adhering portion are formed on the side surface supporting portion close to an end of the glass cover plate, the adhering portion is located on a side of the first protruding portion, the first protruding portion contacts a side surface of the glass cover plate, and the adhering portion is adhered to the glass cover plate by the adhesive layer.

14. The narrow bezel display as claimed in claim 13, wherein the adhering portion is sandwiched between the curved portion the display panel and the gap of the glass cover plate.

15. The narrow bezel display as claimed in claim 10, wherein the side surface supporting portion comprises a second protruding portion, and the recess is defined between the second protruding portion and the bottom surface supporting portion.

16. The narrow bezel display as claimed in claim 15, wherein the glass cover plate is adhered to the second protruding portion of the middle frame.

17. The narrow bezel display as claimed in claim 10, wherein the display panel also comprises a non-displaying portion located on a side of the curved portion, and the curved portion is configured to fold the non-displaying portion to a rear surface of the displaying portion.

18. The narrow bezel display as claimed in claim 10, wherein a cross-section of the recess is semi-circular-shaped or U-shaped.

* * * * *

UNITED STATES PATENT AND TRADEMARK OFFICE
CERTIFICATE OF CORRECTION

PATENT NO. : 10,568,218 B1  
APPLICATION NO. : 16/326211  
DATED : February 18, 2020  
INVENTOR(S) : Huan Xu and Peiyu Lai It is certified that error appears in the above-identified patent and that said Letters Patent is hereby corrected as shown below:

On the Title Page

(30) Foreign Application Priority Data:
Add: "October 16, 2018 (CN)201811200361.5"

Signed and Sealed this  
Twenty-third Day of June, 2020

Andrei Iancu  
*Director of the United States Patent and Trademark Office*